: US009093133B2

United States Patent
Mangano et al.

(10) Patent No.: US 9,093,133 B2
(45) Date of Patent: Jul. 28, 2015

(54) BUFFER FOR ORDERING OUT-OF-ORDER DATA, AND CORRESPONDING INTEGRATED CIRCUIT AND METHOD FOR MANAGING A BUFFER

(71) Applicant: STMicroelectronics S.r.l., Agrate Brianza (IT)

(72) Inventors: Daniele Mangano, San Gregorio di Catania (IT); Salvatore Marco Rosselli, Catania (IT); Giuseppe Falconeri, Sant'Agata li Battiati (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/143,383

(22) Filed: Dec. 30, 2013

(65) Prior Publication Data
US 2014/0185390 A1 Jul. 3, 2014

(30) Foreign Application Priority Data
Jan. 3, 2013 (IT) .............................. TO2013A0004

(51) Int. Cl.
*G11C 8/08* (2006.01)
*G11C 7/10* (2006.01)
*G06F 5/10* (2006.01)

(52) U.S. Cl.
CPC ................ *G11C 7/1006* (2013.01); *G06F 5/10* (2013.01); *G06F 2205/106* (2013.01); *G06F 2205/123* (2013.01)

(58) Field of Classification Search
CPC ..................................... G11C 8/08; G11C 7/10
USPC ......................................... 365/189.05, 230.06
See application file for complete search history.

(56) References Cited

U.S. PATENT DOCUMENTS

| 4,942,553 | A | 7/1990 | Dalrymple et al. |
| 6,189,054 | B1 | 2/2001 | Wenzel |
| 6,996,640 | B1 | 2/2006 | Hill et al. |
| 7,082,504 | B2 | 7/2006 | Rojas et al. |
| 7,996,636 | B1 * | 8/2011 | Prakash et al. ................ 711/162 |
| 8,108,593 | B2 * | 1/2012 | Yano et al. ..................... 711/103 |
| 8,542,693 | B2 * | 9/2013 | Soni et al. ...................... 370/412 |
| 2003/0081341 | A1 * | 5/2003 | Wilson ............................. 360/69 |
| 2003/0163663 | A1 * | 8/2003 | Aasheim et al. .............. 711/202 |

FOREIGN PATENT DOCUMENTS

WO 03/019350 A1 3/2003

OTHER PUBLICATIONS

Extended Italian Search Report, dated Aug. 8, 2013, for Italian Application No. ITTO20130004, 2 pages.

* cited by examiner

Primary Examiner — Michael Tran
(74) Attorney, Agent, or Firm — Seed IP Law Group, PLLC (57) ABSTRACT

A buffer for ordering out-of-order data includes a memory with a plurality of memory locations for temporarily storing data and a detection circuit configured for generating a control signal when the memory locations contain valid data. The detection circuit includes a first block configured for generating validity signals that identify the memory locations containing valid data and a search circuit configured for determining a search pointer as a function of the validity signals. In the case where each memory location contains valid data, the search pointer indicates the last memory location. In the case where at least one memory location is still free, the search pointer indicates the first memory location that is free.

19 Claims, 7 Drawing Sheets

BUFFER FOR ORDERING OUT-OF-ORDER DATA, AND CORRESPONDING INTEGRATED CIRCUIT AND METHOD FOR MANAGING A BUFFER

BACKGROUND

1. Technical Field

The present disclosure relates to digital data buffers with particular attention paid to possible use in buffers that are typically used for ordering out-of-order data.

2. Description of the Related Art

Systems-on-Chip (SoCs) and Systems-in-Package (SiPs) typically comprise a plurality of circuits that communicate with one another via a shared communication channel. For instance, the aforesaid communication channel may be a bus or a communication network, such as for example a Network-On-Chip (NoC) or Network-in-Package (NiP), and is often referred to as "Interconnection Network" (ICN).

For example, the above SoCs are frequently used for processors designed for mobile or multimedia applications, such as smartphones, set-top boxes, or routers for domestic use.

Figure 1:
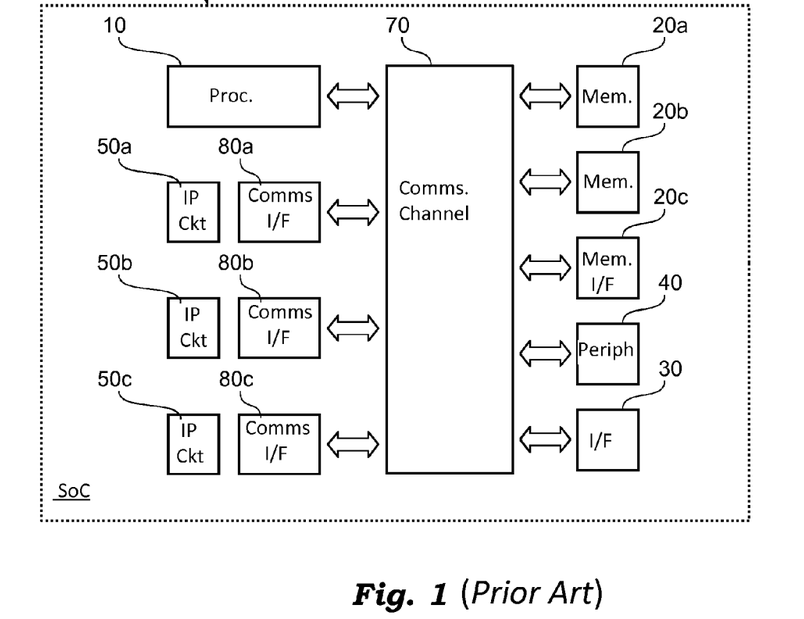

FIG. 1 shows an example of a typical SoC 1.

In the example considered, the system comprises a processor 10 and one or more memories 20. For instance, represented in the example considered are a small internal memory 20a, such as a random-access memory (RAM), a nonvolatile memory 20b, for instance, a flash memory, and a communication interface 20c for an external memory, for instance, a DDR memory.

In the example considered, the system also comprises interface circuits 30, such as input/output (I/O) ports, a Universal Asynchronous Receiver-Transmitter (UART) interface, a Serial Peripheral Interface (SPI), a Universal Serial Bus (USB) interface, and/or other digital and/or analog communication interfaces.

In the example considered, the system also comprises further peripherals 40, such as comparators, timers, analog-to-digital or digital-to-analog converters, etc.

In the example considered, the aforesaid modules, i.e., the blocks 10, 20, 30 and 40, are connected together through a communication channel 70, such as a bus or preferably a Network-On-Chip (NoC).

The general architecture described previously is often used for conventional micro-controllers, which renders any detailed description herein superfluous. Basically, the aforesaid architecture enables interfacing of the processor 10 with the various blocks 20, 30 and 40 via software commands that are executed by means of the processor 10.

In multimedia or mobile processors other blocks 50 are added to the aforesaid generic architecture, which will be referred to hereinafter as Intellectual Property (IP) circuits. For instance, the aforesaid IP blocks 50 may comprise an image or video encoder or decoder 50a, an encoder or decoder of audio signals 50b, a WiFi communication interface 50c, or in general blocks the hardware structure of which is optimized for implementing functions that depend upon the application of the system. These blocks may also be autonomous and interface directly with the other blocks of the system, for example the memories 20 and the other peripherals 30 and 40.

Typically, associated to each IP block 50 is a respective communication interface 80 configured for exchanging data between the IP block 50 and the communication channel 70.

Figure 2A:
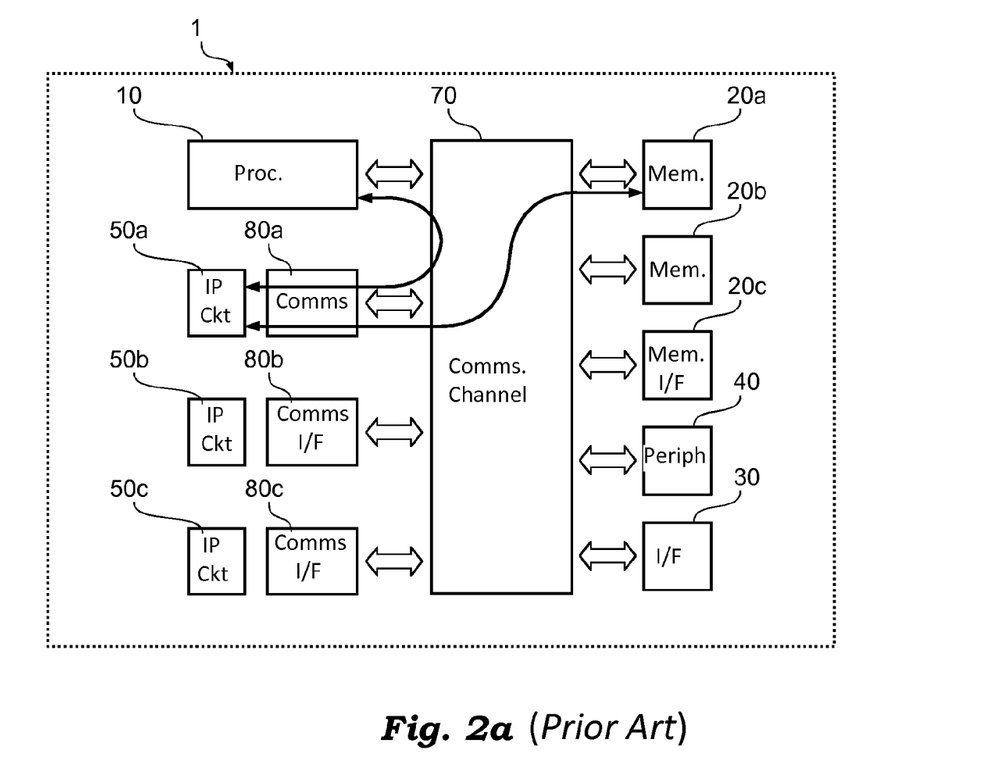
Figure 2B:
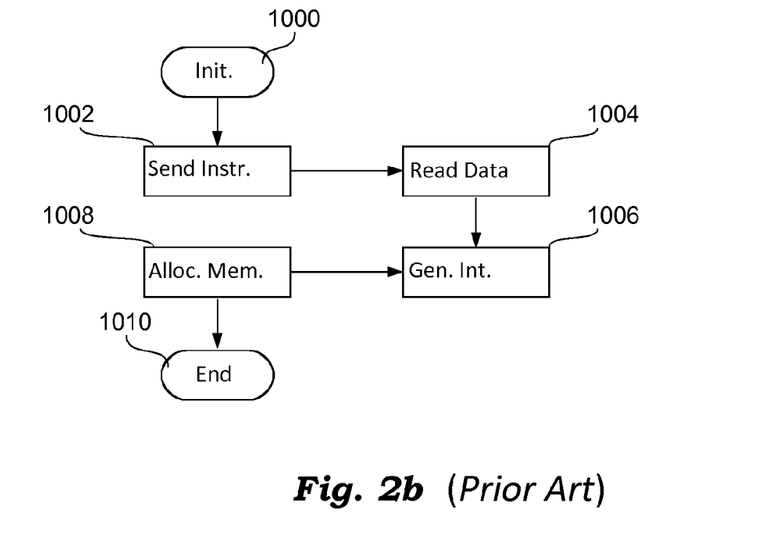

FIGS. 2a and 2b show a scenario of a typical data flow. In particular, FIG. 2a is a block diagram that shows the data flow of a typical data transmission, and FIG. 2b is a flowchart that shows the respective steps of the transmission.

After an initial step 1000, the processor 10 sends to the block 50a, in a step 1002, an instruction that indicates that the memory 20a contains data for the block 50a. For example, for this purpose, the processor 10 can send to the block 50a an instruction that indicates a start address and a stop address inside the memory 20a.

Next, in a step 1004, the block 50a reads the data from the memory 20a by means of the respective communication interface 80a. In particular, typically, the communication interface 80a sends for this purpose to the memory 20a a read request, and the memory sends to the communication interface 80a the requested data. For instance, typically both the read request and the reply are sent via data packets.

Finally, once all the data have been read, the block 50a or the communication interface 80a generates, in a step 1006, an interrupt that signals to the processor 10 the fact that the transmission is through.

Next, the processor 10 can allocate, in a step 1008, the respective area of the memory 20a to another process, and the procedure terminates in a step 1010.

However, in some cases, the interconnection network 70 does not guarantee that the packets will be transmitted with the same transmission time, which is typical for a NoC. Consequently, the reply packets can arrive out of order.

The person skilled in the art will appreciate that there may exist also other possible causes for the lack of order in the replies. For example, the replies may be out of order typically for at least two reasons described below.

1) The "logic" buffers (memory areas) could in actual fact be located on physically separate memories. For instance, this is possible in the presence of advanced mechanisms for management of the memory (for example, Memory Management Units—MMUs), which in effect render the physical organization of the memories transparent, offering the software a unified view. For instance, with reference to FIG. 2a, on account of what has been said above, it may happen, for example, that the read request made by the processor to the module 50a involves two different memories 20a and 20c. In such a condition, the order of the replies depends upon a wide range of factors, such as the order of arrival of the requests to the modules 20a and 20c, the state of the queues internal to the memories 20b and 20c, the type of arbitration performed by the NoC on the replies, etc.

2) The memory controllers (DDR) typically implement different mechanisms aimed at maximizing the efficiency of the memory itself (bandwidth and/or latency). These mechanisms entail reorganization of the order of the accesses that, obviously, implies the introduction of disorder. Consequently, unless memory controllers are used that are able to order the replies (introducing disadvantages in terms of performance), the module 50a/80a could receive replies that are out of order even on the hypothesis where the buffer is allocated on a single physical memory.

Consequently, often the communication interfaces 80 are configured for ordering the data received, and the interrupt is only generated when all the data have been received.

Figure 3:
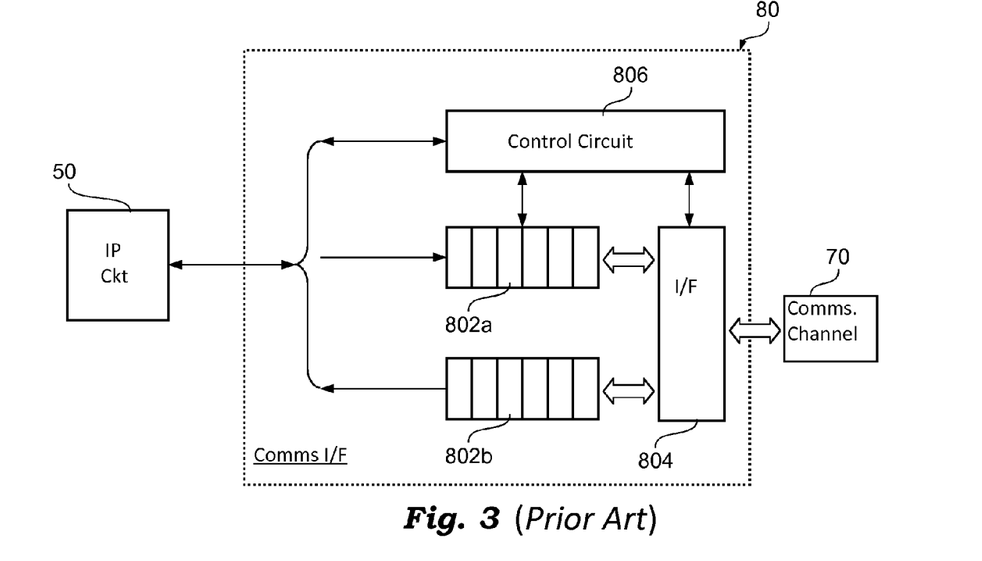

For instance, FIG. 3 shows a block diagram of a typical communication interface 80.

In the example considered, the communication interface 80 comprises:

a transmission memory 802a for temporary saving of outgoing data, i.e., of the data coming from the respective IP block 50;

a reception memory 802b for temporary saving of incoming data, i.e., of the data coming from the communication channel 70;

an interface 804 for exchanging data between the memories 802a, 802b and the communication channel 70, for example for sending the data saved in the transmission memory 802a to the communication channel 70 and saving the data received from the communication channel 70 in the reception memory 802b; and a control circuit 806, which for example controls the data flow between the IP block 50 and the communication channel 70, monitors the state of the memories 802a and 802b, and generates the control signals for the IP block 50.

In the example considered, no interface for exchange of data between the IP block 50 and the memories 802a and 802b is represented because typically the IP block 50 is able to exchange the data directly with the memories 802a and 802b, for example by exploiting the control signals generated by the control circuit 806. For instance, typically access to the memories 802a and 802b is a DMA (Direct Memory Access).

Consequently, in the case of an out-of-order transmission, it is preferable for the data received to be written in the reception memory 802b directly in the right order.

Figure 4:
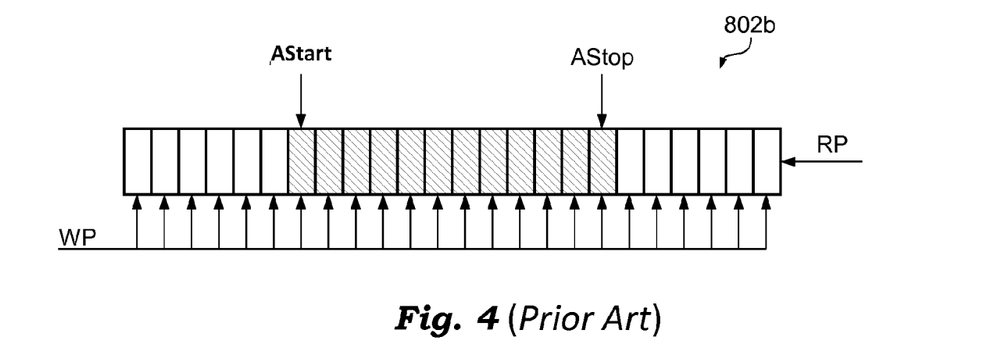

For example, FIG. 4 shows a typical reception buffer 802b that can be used for this purpose.

In the example considered, writing may be random, whereas reading is carried out sequentially.

For instance, typically for each transmission a data area is reserved within the buffer 802b, in which the number of reserved locations N corresponds to the number of data that are to be read. For instance, in the example considered, the aforesaid area is identified via a start address AStart and a stop address AStop.

Typically, the write pointer WP is generated directly by analyzing the data packet received, for example identifying the number of the packet. For instance, the write pointer WP can be determined as the sum of the start address AStart and the number of the packet.

Instead, the read pointer RP corresponds, when initialized, to the start address AStart. Once the respective memory location has been written, the read pointer RP can be incremented sequentially until it reaches the next free memory location or the stop address AStop. Consequently, in the worst case, the last location written is precisely the one identified by AStart and reading of the data can start only when all the data have been written.

For the same reason, a simple counter that counts the number of packets received is not sufficient. In fact, using such a counter, prior to starting to read, it would be necessary to wait for all the data to be written. In the light of the previous observation regarding updating of the read pointer RP, the use of a counter would hence always lead to the latency corresponding to the worst case (i.e., to the case where the last location to be written is precisely the one identified by AStart). Moreover, in the case where there is the need to manage readings from a number of memory regions in parallel (multiple DMAs), the use of a counter is less appropriate on account of the need to manage a number of intervals AStart-AStop and to distinguish to which of these intervals the replies belong.

Consequently, mechanisms are required that enable determination of whether all the data have been received.

Figure 5:
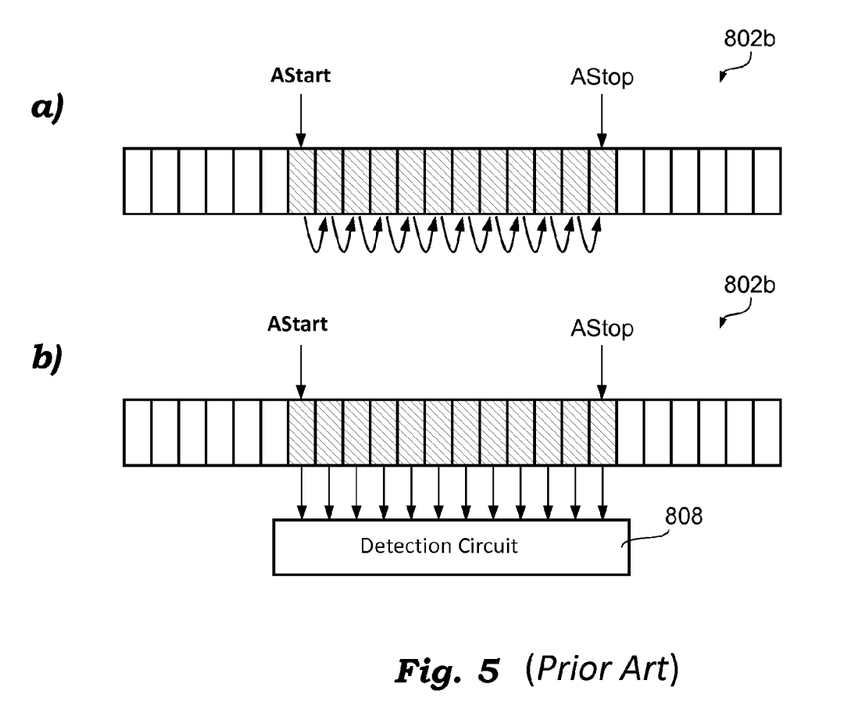

FIGS. 5a and 5b show two possible solutions for determining filling of the area allocated to a given transmission.

In the first solution, a sequential approach is adopted (see FIG. 5a) in which filling of each memory location between the addresses AStart and AStop is verified sequentially. Consequently, in the worst case, N clock cycles are necessary for verifying all the locations, which introduces long delays, and hence is disadvantageous, in particular, if the processor 10 wants to assign the respective memory immediately to other processes.

In the second solution, a parallel approach is adopted (see FIG. 5b), in which filling of each memory location between the addresses AStart and AStop is verified simultaneously via a detection circuit 808. This solution is as a whole faster, but a large combinational circuit 808 is necessary, which may also adversely affect the clock frequency. For instance, typically the critical path increases significantly with the size of the memory. Moreover, also in this case a solution may be required that enables managing in parallel reading from different memory regions (multiple DMAs), and that the Interval AStart-AStop of each DMA may be positioned anywhere in the memory 820b and may have any size.

Similar problems may exist also in other devices that use a buffer for ordering out-of-order data, such as for example a buffer for superscalar processors that support execution of out-of-order instructions.

BRIEF SUMMARY

One embodiment of the present disclosure provides solutions that will overcome the drawbacks outlined above.

With a view to achieving the aforesaid object, embodiments of the disclosure include a buffer for ordering out-of-order data that presents the characteristics specified in the independent claims. The disclosure also regards a corresponding integrated circuit and method. Further advantageous characteristics of the embodiments form the subject of the dependent claims.

The claims form an integral part of the technical teaching provided herein.

In various embodiments, the buffer for ordering out-of-order data comprises a memory for temporarily storing data and a detection circuit that determines whether all the memory locations contain valid data.

In various embodiments, the aforesaid detection circuit comprises a first block that determines validity signals that identify the memory locations containing valid data. For instance, in various embodiments, the aforesaid block comprises a control memory and a circuit that monitors the operations of writing in the memory of the buffer and writes respective control data in the control memory.

In various embodiments, the detection circuit also comprises a search circuit that determines a search pointer as a function of the validity signals. For example, in the case where all the memory locations contain valid data, the search pointer indicates the last memory location. Instead, in the case where at least one memory location is still free, the search pointer indicates the first memory location that is free.

For instance, in one embodiment, the search circuit comprises a register for storing the search pointer, and the search pointer initially indicates the first memory location. In this case, a circuit can determine for the current search pointer the number of the next memory locations containing valid data, and an adder can add the number of the next memory locations containing valid data to the search pointer.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. One or more embodiments are described hereinafter with reference to the accompanying drawings. Various embodiments will now be described purely by way of non-limiting example with reference to the annexed drawings, in which:

FIGS. 1 to 5 have already been described previously;

DETAILED DESCRIPTION

In the ensuing description, various specific details are illustrated aimed at providing an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of the present description is meant to indicate that a particular configuration, structure, or characteristic described in relation to the embodiment is comprised in at least one embodiment. Hence, phrases such as "in an embodiment" or "in one embodiment" that may be present in different points of the present description do not necessarily refer to one and the same embodiment. Moreover, specific conformations, structures, or characteristics may be combined adequately in one or more embodiments.

The references used herein are provided merely for convenience and hence do not define the sphere of protection or the scope of the embodiments.

As mentioned previously, the object of the present description is to provide solutions that enable determination of whether a given number of memory locations of a buffer contain valid data.

Figure 6:
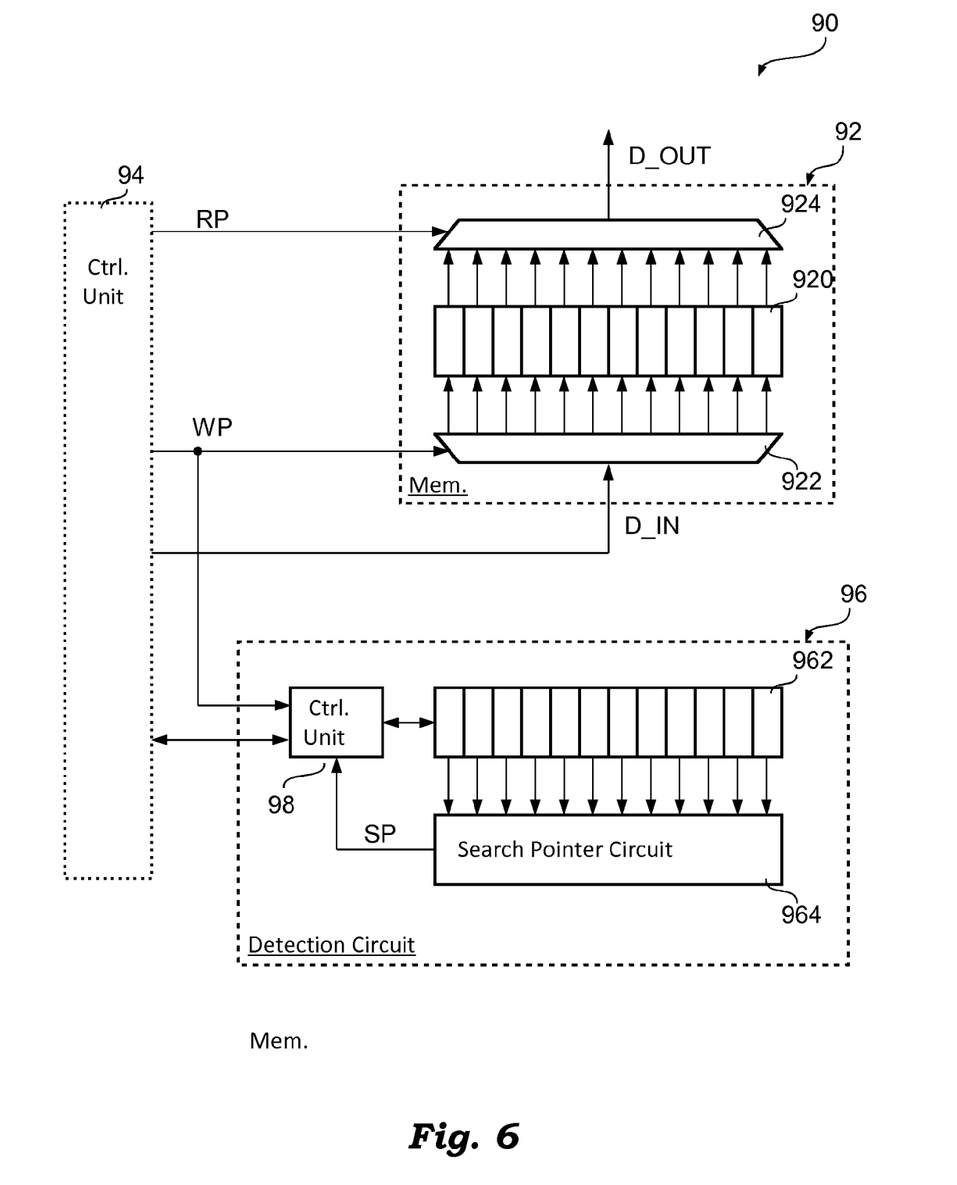
FIGS. 6 to 11 show various details of a buffer for ordering data according to the present description.

FIG. 6 shows the general structure of a buffer according to the present description.

In the embodiment considered, the buffer 90 comprises a memory 92 with a plurality of memory locations, where each location comprises a pre-set number of bits.

In the embodiment considered, the memory 92 comprises a read interface and a write interface. In particular, in the embodiment considered, a write pointer WP indicates the current memory location for an operation of writing of data D_IN in the memory 92 and a read pointer RP indicates the current memory location for an operation of reading of data D_OUT from the memory 92.

For instance, such a memory 92 can be provided via an array of registers or a RAM (Random Access Memory) 920, in which the write interface comprises a de-multiplexer 922 and the read interface comprises a multiplexer 924.

In the embodiment considered, the pointers WP and RP are provided by an external control unit 94, such as for example the control unit 806 of the communication interface 80.

In particular, in the embodiment considered, at least the write pointer WP can be set randomly, as for a conventional RAM.

As mentioned previously, the control unit 94 is typically configured for receiving data that are out of order and for saving the aforesaid data in the memory 92 in order. For instance, each data packet that is transmitted through the interconnection network 70 could comprise a header and the data as payload. In this case, the header could comprise a field that enables identification of the number of the respective packet within a transmission. Consequently, the control unit 94 could analyze the header, determine the number of the respective packets, and save the data in an orderly way in the respective memory location.

In general, also the read pointer RP could be set randomly, but typically the aforesaid pointer RP is provided by a counter for reading the data from the memory sequentially.

In various embodiments, a certain number N of memory locations within the memory 92 can be reserved for each transmission, where the number N corresponds to the number of data that are to be received. For instance, the aforesaid memory locations can be identified via a start address AStart and a stop address AStop.

Consequently, for writing the data in the memory 92, the control unit 94 can write the first data, for example the data of the packet with the sequence number 1, in the memory location that corresponds to the address AStart and the last data, for example the data of the packet with the sequence number N, in the memory location that corresponds to the address AStop. Instead, for reading the data, the control unit 94 could set the read pointer RP on the address AStart and consecutively increment the pointer RP until the address AStop is reached. The general operation of such a buffer for ordering out-of-order data is well known in the art, which renders any detailed description herein superfluous.

In fact, the present description offers solutions that enable determination of whether all the memory locations reserved have been written, i.e., when each of the N memory locations contains valid data.

For this purpose, a detection circuit 96 is added to the buffer 90.

In various embodiments, the aforesaid detection circuit 96 generates validity signals that identify the memory locations reserved that contain valid data.

For instance, in the embodiment considered, a control memory 962 is used that contains control data. Basically, the aforesaid control memory 962 enables identification of whether a given memory location has been written, i.e., whether a given memory location contains valid data or not. For example, in the embodiment considered, a control unit 98 is associated to the memory 962. The aforesaid control unit 98 monitors the operations of writing in the memory 92 and writes control data in the control memory 962 that identify the memory locations that have been written.

Moreover, in various embodiments, the aforesaid control memory 962 identifies also the memory locations that have been reserved for a transmission, i.e., data that enable identification of the addresses AStart and AStop. Consequently, the aforesaid memory enables specification of the number of the memory locations reserved and/or the position of the memory locations reserved within the memory 92.

In various embodiments, the detection circuit 96 comprises a circuit 964 configured for determining a search pointer SP that indicates the next free memory location.

Figure 7:
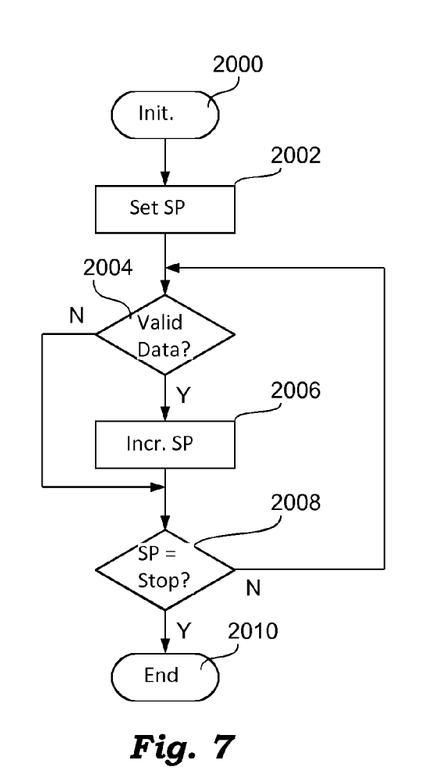

FIG. 7 shows a flowchart that summarizes the main operations that are carried out by the circuit 964.

After a start step 2000, the search pointer SP is set in a step 2002 on the address AStart.

Next, the circuit 964 monitors the control memory 962 for verifying, in a step 2004, whether the memory location indicated by the search pointer SP contains valid data, i.e., whether new data have been written in the respective memory locations.

In the case where the respective memory location does not yet contain valid data (output "N" from the verification step 2004), the search pointer SP remains unvaried; i.e., the search pointer SP continues to point to the same memory location.

Instead, in the case where the respective memory location contains valid data (output "Y" from the verification step 2004), the search pointer SP is incremented in a step 2006 in such a way that the search pointer SP points to the next free memory location, and at the most to the last memory location reserved.

The aforesaid operations, i.e., the steps 2004 and 2006, are repeated until the search pointer SP reaches the last memory location that corresponds to the address AStop.

For instance, in the embodiment considered, the value of the search pointer SP is compared with the address AStop in a step 2008, and in the case where the search pointer SP corresponds to the address AStop (output "Y" from the verification step 2008) the procedure terminates in a step 2010.

Instead, in the opposite case (output "N" from the verification step 2008), the procedure is repeated in step 2004.

Consequently, the search circuit 964 determines a search pointer SP as a function of the validity signals indicated by the memory 962, in which:

in the case where each memory location reserved contains valid data, the search pointer SP indicates the last memory location reserved, i.e., the address AStop, and in the case where at least one memory location reserved is still free, the search pointer SP indicates the first memory location reserved that is free.

Figure 8:
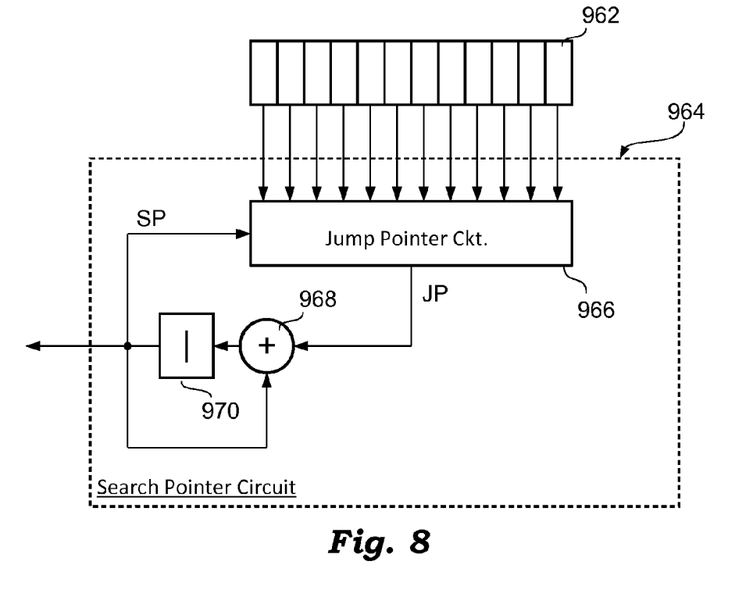

For instance, FIG. 8 shows a possible embodiment of the circuit 964.

In the embodiment considered, the circuit 964 comprises a circuit 966 that determines a jump pointer JP. The aforesaid jump pointer JP corresponds to the number of the subsequent memory locations that are occupied for a given memory location that is identified via a search pointer SP.

In the embodiment considered, the aforesaid search pointer SP is supplied by an adder 968 that determines the sum of the search pointer at the previous instant in time and the jump pointer JP. For example, in the embodiment considered, the search pointer SP is saved for this purpose in a register 970. As mentioned previously, the aforesaid pointer SP initially corresponds to the address AStart.

Consequently, in the case where no data are saved in the current memory location identified via the search pointer SP, the jump pointer JP is zero, and consequently also the search pointer SP remains unvaried.

Instead, in the case where data are saved in the current memory location identified via the search pointer SP, the jump pointer JP indicates the number of the next memory locations occupied, and the search pointer SP is set via the adder 970 on the next free memory location, or at the most on the last memory location reserved.

This procedure is repeated until the search pointer SP reaches the last memory location reserved, which corresponds to the address AStop.

Figure 9:
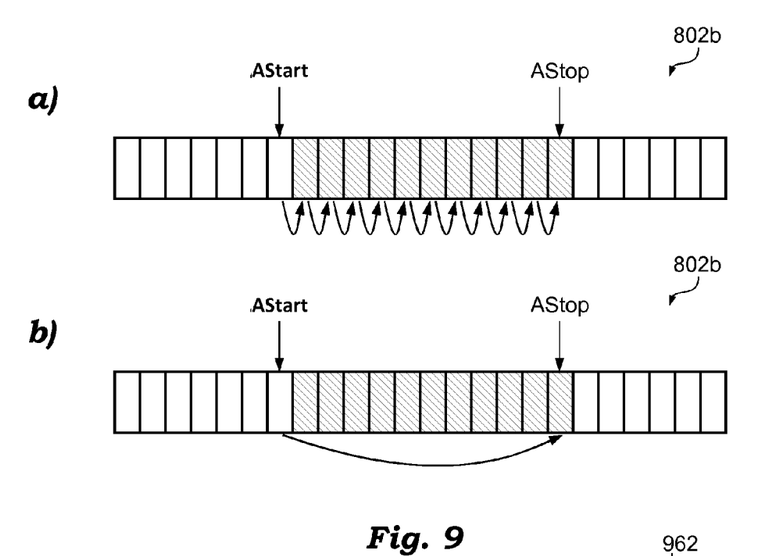

FIGS. 9a and 9b illustrate the direct comparison between a sequential approach (FIG. 9a) and the solution proposed (FIG. 9b).

In the example considered, the memory contains twelve memory locations that are reserved for a communication. Moreover, in the example considered the first packet, i.e., the data that are to be saved in the first memory location that corresponds to the address AStart, is received as last packet.

Consequently, for the case of the example, the sequential approach would require twelve clock cycles, whereas a single clock cycle is sufficient for the solution proposed because the jump to the last position is already pre-calculated via the circuit 966.

Figure 10:
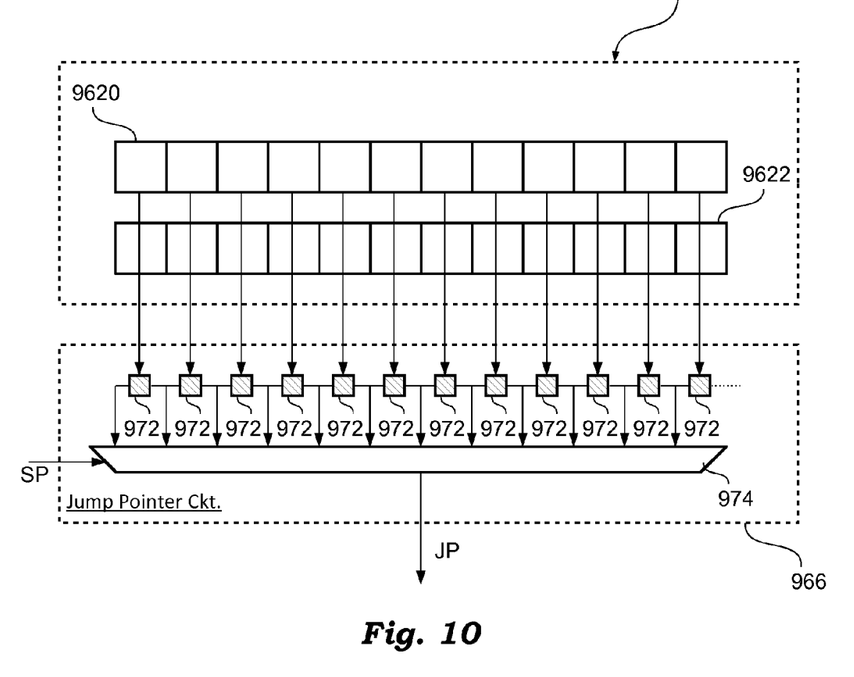

FIG. 10 shows a possible embodiment of the circuit 966 that determines a jump pointer JP.

In the embodiment considered, the memory 962 comprises, for each memory location of the memory 92, two bits 9620 and 9622. The person skilled in the art will appreciate that the memories 92 and 962 may also be implemented via a single memory.

The first bit 9620 enables identification of whether a given memory location of the memory 92 contains valid data. For instance, the control unit 98 can monitor the operations of writing in the memory 92, and when data are saved in the memory 92, the control unit 98 can update the respective bit 9620 also in the memory 966. For example, in one embodiment, the control unit 98 uses for this purpose the write pointer WP; for instance, it writes the bit that is indicated via the write pointer WP.

Instead, the second bit 9622 enables identification of the memory locations reserved for a given transmission.

In the embodiment considered, the circuit 966 is implemented via a chain of adder nodes 972. Basically, associated to each memory location of the memory 92 is a circuit 972 that determines whether the respective memory location is full and whether the respective memory location is the last memory location reserved. In the case where the memory location contains valid data and the memory location is not the last location reserved, the respective memory location can be skipped. Instead, in the case where the memory location is empty or the memory location is the last location reserved, the search pointer would have to stop at the aforesaid memory location.

Consequently, in the embodiment considered, the adder nodes 972 are connected in series, where the first adder node 972 of the chain is associated to the last memory location and the last adder node 972 of the chain is associated to the first location.

In this case, each adder node 972 can be configured for:

a) in the case where the respective memory location is empty or the respective memory location is the last location reserved, setting the respective output to zero; or b) otherwise, incrementing the signal coming from the previous adder node 972.

Consequently, the outputs of the various adder nodes supply the number of jumps that are necessary for jumping directly from a given memory location to the first free memory location or at the most to the last memory location reserved.

For instance, in the embodiment considered a multiplexer 974 is used, driven via the search pointer SP for selecting the number of jumps that are necessary for the current search pointer SP.

For instance, in the example shown in FIG. 9b, twelve memory locations are reserved; i.e., $$AStop=AStart+11$$

and the memory location AStart is written as last memory location.

Consequently, the adder node 972 associated to the memory location AStop would supply at output the zero value (last memory location reserved). The subsequent adder nodes 972 detect that the respective memory locations are already full and hence increment the signal of the preceding adder node 972. Consequently, the adder node in position AStart+1 would supply at output a signal that indicates the value 10. Instead, the adder node at the location AStart detects no valid data and consequently sets its output to zero.

As a result, the search pointer SP remains at the position AStart because the jump pointer SP is set to zero for the location AStart (SP=SP+0).

Instead, when data are written in the memory location AStart, also the adder node 972 associated to the address AStart detects a valid datum and increments the signal of the preceding adder node 972 to the address AStart+1; i.e., the adder node associated to the address AStart now supplies at output the value 11.

Consequently, the search pointer SP jumps immediately to the last memory location reserved (SP=SP+11).

In various embodiments, this event generates an interrupt. For instance, this interrupt can be generated when the search pointer SP reaches the address AStop and the memory location indicated by the address AStop contains valid data.

Figure 11:
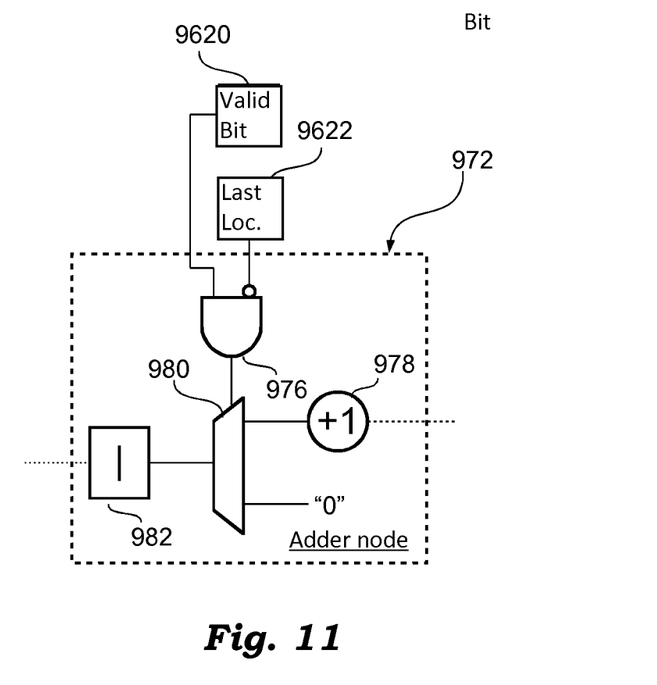

FIG. 11 shows a possible embodiment of the adder node 972.

In the embodiment considered, the bits 9620 that indicate whether the respective memory location contains valid data are initially set to '0' and when valid data are saved in a memory location, the respective bit is set to '1'.

Instead, the bits 9622 that indicate the limit of the memory locations reserved are also set initially to '0' and only the bit for the position AStop is set to '1'. In fact, it is not necessary to indicate explicitly the start address AStart because this address can be specified implicitly by setting the search pointer SP on the address AStart.

Consequently, in the embodiment considered, an AND gate 976 is sufficient with an inverting input to determine whether the data for the respective memory location are valid and the memory location is not the last location reserved.

In the embodiment considered, an adder 978 is used that increments the signal coming from the preceding node 972, i.e., the adder 978 adds the value 1 to the value coming from the preceding node 972.

Instead, the selection of the incremented value coming from the adder 978 or the zero value is obtained with a multiplexer 980.

Consequently, the adder node 972 is configured for:

a) in the case where the respective memory location is empty or the respective memory location is the last location reserved, setting the respective output to zero; or b) in the case where the respective memory location contains valid data and the respective memory location is not the last location reserved, incrementing the signal coming from the preceding adder node 972.

Optionally, the adder node 972 can also comprise a register 982 configured for saving the signal at output. Basically, the aforesaid register can be used as a stage of a pipeline for interrupting the chain of combinational blocks. Consequently, even just some adder nodes 972 can comprise a register 982.

Consequently, with the solution here described, a single clock cycle is sufficient (or possibly two clock cycles if registers are provided at output from the adder nodes 972) to determine filling of the memory 92. Consequently, the solution here described has a speed that is comparable with a parallel approach, but involves a much lower complexity.

Moreover, the search pointer SP always indicates filling of the buffer 90. Consequently, even though not all the data have yet been received, the read pointer RP can be incremented until the search pointer SP is reached; i.e., the data between the address AStart and the memory location indicated by the pointer SP may even be read prior to completion of transmission.

Of course, without prejudice to the principle of the invention, the details of construction and the embodiments may vary widely respect to what has been described and illustrated herein purely by way of example, without thereby departing from the scope of the present invention, as defined by the ensuing claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A buffer to order out-of-order data, comprising:
   a memory having N memory locations to temporarily store data; and
   a detection circuit configured to generate a control signal when each memory location of said N memory locations contains valid data, said detection circuit including:
      a first block configured to generate validity signals that identify the memory locations of said N memory locations containing valid data; and
      a search circuit configured to determine a search pointer as a function of said validity signals, wherein:
         in a first case where each memory location of said N memory locations contains valid data, said search pointer indicates a last memory location of said N memory locations; and
         in a second case where at least one memory location of said N memory locations is still free, said search pointer indicates a first memory location of said N memory locations that is free, wherein said search circuit includes a circuit configured to generate an interrupt when said search pointer reaches the last memory location of said N memory locations and the last memory location of said N memory locations contains valid data.

2. The buffer according to claim 1 wherein said first block comprises:
   a valid data memory; and
   a control circuit, said control circuit configured to:
      monitor writing operations in a first number of memory locations of said N memory locations, and
      write control data in said valid data memory, said control data configured to identify the first number of memory locations of said N memory locations that have been written.

3. The buffer according to claim 1, comprising:
   a reserved data memory, the reserved data memory configured to specify at least one of:
      a number of said N memory locations within said memory; and
      a position of said N memory locations within said memory.

4. The buffer according to claim 1 wherein said search circuit comprises:
   a register configured to store said search pointer, said search pointer arranged to indicate at initialization a first memory location of said N memory locations;
   a second block configured to determine a number of next memory locations of said N memory locations containing valid data; and
   an adder configured to add said search pointer and said number of next memory locations containing valid data.

5. The buffer according to claim 4 wherein said second block contains a chain of adder nodes, at least one adder node associated to each memory location of said N memory locations, wherein a first adder node of the chain of adder nodes is associated to the last memory location and a last adder node of the chain of adder nodes is associated to the first memory location.

6. The buffer according to claim 5 wherein each adder node of the chain of adder nodes is configured to determine whether an associated memory location contains valid data and whether the associated memory location is or is not the last memory location of said N memory locations, wherein in a case where the associated memory location contains valid data and the associated memory location is not the last memory location of said N memory locations, said adder node is configured to increment a signal coming from a preceding adder node or in a case where the associated memory location does not contain valid data or the associated memory location is the last memory location of said N memory locations, said adder node is configured to set an output to zero.

7. The buffer according to claim 5 wherein at least one adder node of said chain of adder nodes comprises an output register.

8. The buffer according to claim 4, wherein said second block includes a multiplexer configured to select an output of an adder node based on said search pointer.

9. An integrated circuit, comprising:
a buffer having N memory locations and a detection circuit, said detection circuit including:
a first block to generate validity signals that identify M memory locations of said N memory locations that contain valid data; and
a search circuit to determine a search pointer as a function of said validity signals, wherein in a first case where M equals N, said search pointer is set to a last memory location of said N memory locations and wherein in a second case where M is less than N, said search pointer is set to a first memory location of said N memory locations that is free; and
a control unit to:
receive data packets that are out of order, each data packet having an associated sequence number; and
write data of said data packets in said buffer in an orderly way based on the associated sequence numbers.

10. The integrated circuit of claim 9 wherein said first block comprises:
a control circuit to generate control data, the control data arranged to identify a first number of memory locations of said N memory locations that have been written.

11. The integrated circuit of claim 9, comprising:
a reserved data memory, the reserved data memory arranged to specify at least one of a number of said N memory locations within said memory and a position of said N memory locations within said memory.

12. The integrated circuit of claim 9 wherein said search circuit comprises:
a register to store said search pointer, said search pointer arranged to store at initialization a first memory location of said N memory locations;
a second block to determine a number of next memory locations of said N memory locations containing valid data; and
an adder to add said search pointer and said number of next memory locations containing valid data.

13. The integrated circuit of claim 12 wherein said second block includes a chain of adder nodes arranged for initialization such that a first adder node of the chain of adder nodes is associated to the last memory location, a last adder node of the chain of adder nodes is associated to the first memory location, and at least one adder node is associated to each memory location of said N memory locations.

14. The integrated circuit of claim 12 wherein said second block includes a multiplexer to select an output of an adder node based on said search pointer.

15. A method to manage a buffer for ordering out-of-order data, said buffer including a memory having a number N of memory locations to temporarily store data, comprising:
generating validity signals that identify M memory locations of said N memory locations containing valid data;
determining a search pointer as a function of said validity signals, wherein:
in a first case where M equals N, said search pointer indicates a last memory location of said N memory locations; and
in a second case where at least one memory location is still free, said search pointer indicates a first memory location of said N memory locations that is free; and
generating an interrupt when said search pointer reaches the last memory location of said N memory locations and the last memory location of said N memory locations contains valid data.

16. The method of claim 15, comprising:
generating control data, the control data corresponding to a plurality of memory locations of said N memory locations that have been written.

17. The method of claim 15, comprising:
specifying at least one of a number of said N memory locations within said memory; and
specifying a position of said N memory locations within said memory.

18. The method of claim 15, comprising:
initializing said search pointer to a first memory location of said N memory locations;
determining a number of next memory locations of said N memory locations containing valid data; and
adding said search pointer and said number of next memory locations containing valid data.

19. The method of claim 15, comprising:
initializing a chain of adder nodes by associating a first adder node of the chain of adder nodes to the last memory location, associating a last adder node of the chain of adder nodes to the first memory location, and associating at least one adder node to each memory location of said N memory locations.

* * * * *